United States Patent [19]
Higashi et al.

[11] Patent Number: 5,777,386
[45] Date of Patent: Jul. 7, 1998

[54] SEMICONDUCTOR DEVICE AND MOUNT STRUCTURE THEREOF

[75] Inventors: Mitsutoshi Higashi; Hajime Iizuka; Kei Murayama, all of Nagano, Japan

[73] Assignee: Shinko Electric Industries Co., Ltd., Nagano, Japan

[21] Appl. No.: 698,624

[22] Filed: Aug. 16, 1996

[30] Foreign Application Priority Data

Aug. 23, 1995 [JP] Japan ................... 7-214466

[51] Int. Cl.⁶ ........................................... H01L 23/48
[52] U.S. Cl. ................... 257/737; 257/738; 257/778
[58] Field of Search .................... 257/778, 723, 257/705, 737, 734

[56] References Cited

U.S. PATENT DOCUMENTS

| 5,155,661 | 10/1992 | Nagesh et al. | 257/705 |
| 5,616,958 | 4/1997 | Laine et al. | 257/778 |

Primary Examiner—Tom Thomas
Assistant Examiner—Roy Potter
Attorney, Agent, or Firm—Pennie & Edmonds LLP

[57] ABSTRACT

A semiconductor device includes a semiconductor element having first and second surfaces. The element has connecting terminals on the first surface. A substrate has a substrate surface on which external connecting terminals and conductive patterns are formed. The connecting terminals of the semiconductor element are electrically connected to the external connecting terminals by means of the conductive patterns. The connecting terminals of the semiconductor element are each connected to one end of respective ones of the conductive patterns of the substrate by a flip-chip bonding. Resin hermetically seals the connecting terminals of the semiconductor element, so that the second surface of the semiconductor element is not covered by the sealing resin. A mounting substrate has a surface provided with circuit patterns. The semiconductor device is mounted on the mounting substrate in such a manner that the external connecting terminals are electrically connected to the circuit patterns of the mounting substrate and the second surface of the semiconductor element comes into contact with the surface of the mounting substrate.

15 Claims, 4 Drawing Sheets

1

SEMICONDUCTOR DEVICE AND MOUNT STRUCTURE THEREOF

BACKGROUND OF THE INVENTION

1. Field of the Invention

The present invention relates to a semiconductor device and a mount structure for mounting such a semiconductor device. More particularly, this invention relates to a semiconductor device and a mount structure thereof, in which the semiconductor device comprises: a semiconductor element having first and second surfaces, connecting terminals on the first surface; a substrate having a substrate surface on which external connecting terminals and conductive patterns are formed, so that the connecting terminals of the semiconductor element are electrically connected to the external connecting terminals by means of the conductive patterns; and resin for hermetically sealing the connecting terminals of the semiconductor element.

2. Description of the Related Art

In a semiconductor device conventionally known in the prior art, a package 100 which is formed by laminating a plurality of printed circuit boards, made of, for example, BT resin, has a cavity, in which a semiconductor element or chip 102 is mounted by means of suitable adhesive, such as a silver paste, a thermally endurable resin, or other adhesive. Connecting terminals of the semiconductor element 102 are electrically connected to ends of the internal conductive patterns 105 of the multilayer circuit board 104 by means of bonding wires 106.

The internal conductive patterns 105 are also connected to conductive patterns 108 formed on the circuit board at the periphery of the cavity of the package 100 by means of through holes 107, 107. External connecting terminals, such as solder balls 110, are formed on external connecting pads formed on the conductive patterns 108.

In such a semiconductor device, the semiconductor element 102 and the bonding wires 106 are hermetically sealed by a sealing resin film 112 formed by potting. The conductive patterns 108 around the cavity and the periphery thereof, except for the external connecting pads, are covered and protected by a solder resist coat 114.

Such a semiconductor device is mounted on a mounting substrate 116 in such a manner that the solder balls come in to contact with circuit patterns on the mounting substrate. Thus, the solder balls 110 are simultaneously subjected to a reflow process and thus a gap 118 remains between the mounting substrate 116 and the semiconductor element 102.

Most of the heat generated in the semiconductor device 102 is radiated through a package 100 which is directly in contact with the semiconductor element 102.

In such a semiconductor device, to effectively radiate the heat generated in the semiconductor element 102 to the outside of the package 100, the chip mount portion, such as the bottom surface of the package 100, is formed with a copper plate to improve the heat conductivity between the semiconductor element 102 and the package 100.

However, as shown in FIG. 8, since the semiconductor element 102 is covered with the package 100 and the sealing resin 112, the heat radiation can only be attained by one of the surfaces of the semiconductor element 102 facing the package 100. In addition, it is difficult to arrange heat radiating fins on the surface of the sealing resin, since the gap 118 is too narrow.

SUMMARY OF THE INVENTION

An object of the present device is to provide a semiconductor device and a mount structure thereof, in which a heat radiation can effectively be attained from both sides of the semiconductor element.

According to the present invention, there is provided a semiconductor device comprising: a semiconductor element having first and second surfaces, the semiconductor element having connecting terminals on the first surface; a substrate having a substrate surface on which external connecting terminals and conductive patterns are formed, so that the connecting terminals of the semiconductor element are electrically connected to the external connecting terminals by means of the conductive patterns; the connecting terminals of the semiconductor element being connected to one end of each of the conductive patterns of the substrate by a flip-chip bonding; and resin for hermetically sealing the connecting terminals of the semiconductor element, so that the second surface of the semiconductor element is exposed.

The external connecting terminals may be solder balls. The substrate can be made of ceramic containing aluminum nitride. The second surface of the semiconductor element is at the same level as the tops of the solder balls.

According to another aspect of the present invention, there is provided a semiconductor device comprising: a semiconductor element having first and second surfaces, the semiconductor element having connecting terminals on the first surface; a flexible substrate made of a flexible film having a first surface, on which external connecting terminals and conductive patterns are formed, and a second surface, so that the connecting terminals of the semiconductor element are electrically connected to the external connecting terminals by means of the conductive patterns; the connecting terminals of the semiconductor element being connected to one end of each of the conductive patterns of the substrate by a flip-chip bonding; resin for hermetically sealing the connecting terminals of the semiconductor element, so that the second surface of the semiconductor element is exposed; and a heat radiating frame attached to the second surface of the flexible substrate.

The flexible substrate has an element mount area within which the semiconductor element is mounted by the flip-chip bonding and the heat radiating frame has a recess or opening at a position corresponding to the element mount area.

According to still another aspect of the present invention, there is provided a mount structure of a semiconductor device, the structure comprising:

a semiconductor device comprising: a semiconductor element having first and second surfaces, the semiconductor element having connecting terminals on the first surface; a substrate having a substrate surface on which external connecting terminals and conductive patterns are formed, so that the connecting terminals of the semiconductor element are electrically connected to the external connecting terminals by means of the conductive patterns; the connecting terminals of the semiconductor element being connected to one end of each of the conductive patterns of the substrate by a flip-chip bonding; and resin for hermetically sealing the connecting terminals of the semiconductor element, so that the second surface of the semiconductor element is exposed;

a mounting substrate having a surface provided with circuit patterns; and the semiconductor device mounted on the mounting substrate in such a manner that the external connecting terminals are electrically connected to the circuit patterns of the mounting substrate and the second surface of the semiconductor element comes into contact with the surface of the mounting substrate.

It is advantageous that the second surface of the semiconductor element comes into contact with the surface of the mounting substrate by means of a thermally conductive adhesive layer.

According to a further aspect of the present invention, there is provided a mount structure of a semiconductor device, the structure comprising:

a semiconductor device comprising: a semiconductor element having first and second surfaces, the semiconductor element having connecting terminals on the first surface; a flexible substrate made of a flexible film having a first surface, on which external connecting terminals and conductive patterns are formed, and a second surface, so that the connecting terminals of the semiconductor element are electrically connected to the external connecting terminals by means of the conductive patterns; the connecting terminals of the semiconductor element being connected to one end of each of the conductive patterns of the substrate by a flip-chip bonding; resin for hermetically sealing the connecting terminals of the semiconductor element, so that the second surface of the semiconductor element is exposed; and a heat radiating frame attached to the second surface of the flexible substrate; and a mounting substrate having a surface providing with circuit patterns; and the semiconductor device mounted on the mounting substrate in such a manner that the external connecting terminals are electrically connected to the circuit patterns of the mounting substrate and the second surface of the semiconductor element comes into contact with the surface of the mounting substrate.

DETAILED DESCRIPTION OF THE EMBODIMENTS

Some embodiments of a semiconductor device according to the present invention will now be explained in detail with reference to drawings.

Figure 1:
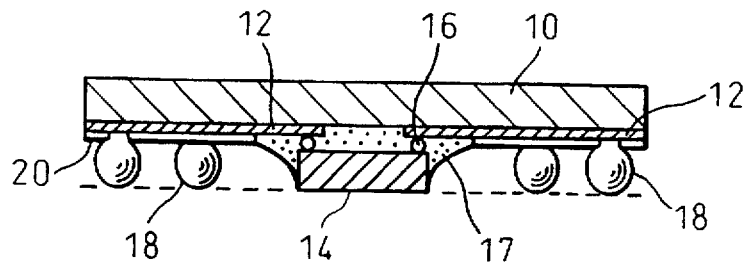
FIG. 1 is a vertical cross-sectional view of an embodiment of a semiconductor device of this invention.

In FIG. 1, an embodiment of a semiconductor device of this invention is shown. A substrate 10 is made of ceramic containing aluminum nitride having relatively good heat conductivity. On a surface of the substrate 10 formed are conductive patterns 12, inner ends of which are electrically connected to solder bumps 16 formed on one side of a semiconductor element or chip 14 by means of a flip-chip bonding. Solder bumps 16 are connecting terminals of the semiconductor element 14.

At the outer ends of the conductive patterns 12 pads are arranged for external connecting terminals, to which solder balls 18, 18, . . . are attached.

The connected portions between the inner ends of the conductive patterns 12 and the solder bumps 16 of the semiconductor element 14 are hermetically sealed with resin, i.e., underfilling material, such as epoxy resin 17, formed by a potting process.

In the semiconductor device shown in FIG. 1, the other surface (lower surface in FIG. 1) of the semiconductor element 14 and most of the area of the conductive patterns 12 are not covered by the sealed underfilling material layer 17 and are exposed to the outside.

However, the exposed portions of the conductive patterns 12, except for the pads for external connecting terminals, are coated with solder resist 20, so that the pads for external connecting terminals and the other surface of the semiconductor element 14 are to be exposed faces.

Figure 2:
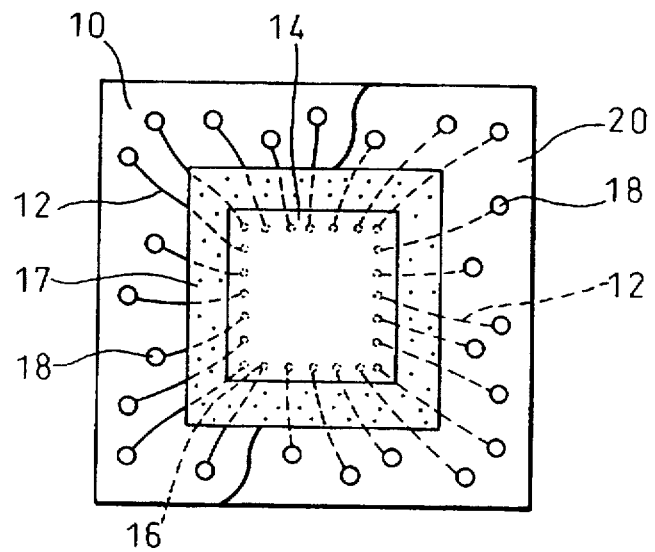
FIG. 2 is a bottom view of the embodiment shown in FIG. 1 seen from the solder balls.

FIG. 2 is a bottom view of the semiconductor device seen from the side of the solder balls 18. In FIG. 2, the solder resist 20 is partially removed for illustration. The outer ends of the conductive patterns 12 are extended outwardly to the outer peripheral area of the substrate 10 and formed with the pads for external connecting terminals, to which solder balls 18, 18, . . . are attached.

In the embodiment shown in FIGS. 1 and 2, the semiconductor element 14 having their terminals of solder bumps 16 arranged along the periphery thereof is mounted. However, if a semiconductor element having their terminals arranged over the whole surface thereof (not shown), the circuit patterns 12 should be arranged in an array patterns so as to conform to the arrangement of the terminals of the semiconductor element.

In the semiconductor device shown in FIGS. 1 and 2, the height of the solder balls are controlled in such a manner that, when the semiconductor device is mounted on a mounting substrate or a motherboard, the solder balls 18, 18, . . . are connected to the circuit patterns on the mounting substrate and the exposed surface of the semiconductor element 14 is in contact with the surface of the mounting substrate.

Figure 3:
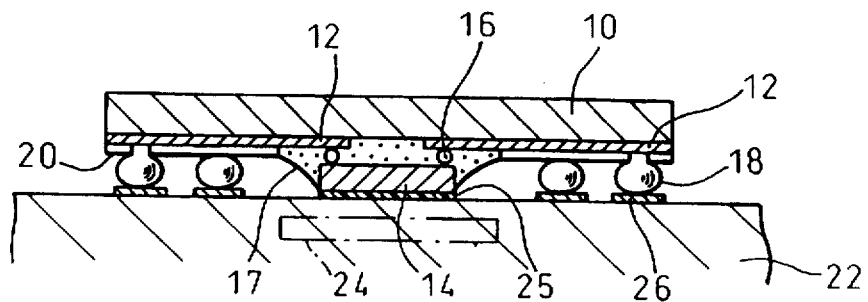
FIG. 3 is a cross-sectional view of a mount structure of a semiconductor device shown in FIG. 1.

Therefore, as shown in FIG. 3, when the solder balls 18, 18, . . . are placed on the connecting pads 26 provided on the circuit patterns of the mounting substrate 22 to mount the semiconductor element 14 onto the mounting substrate 22, the exposed surface of the semiconductor element 14 is in contact with and firmly adhered to the surface of the mounting substrate 22 by means of a thermally conductive adhesive 25 containing metal particles, made of a material such as copper. Such an adhesive 25 may be a silicone paste containing copper particles aluminum nitride particles.

Figure 8:
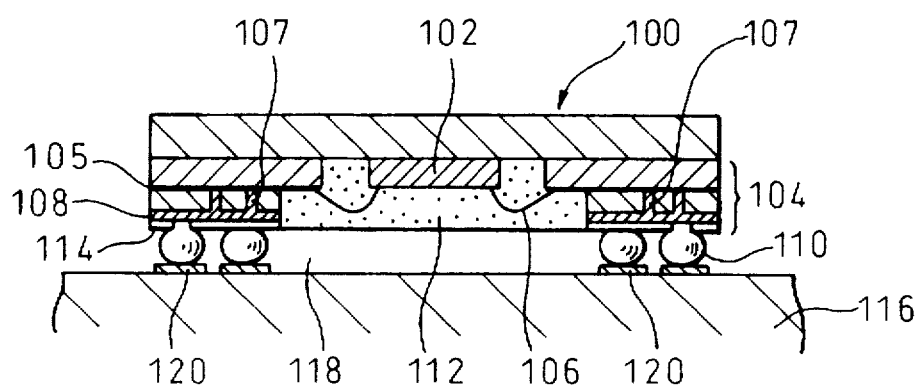
FIG. 8 is a cross-sectional view of a conventionally known semiconductor device mounted on a mounting substrate.

The heat generated in the semiconductor element 14 is thus radiated through the solder bumps 16 to the substrate 10 of the semiconductor device and also through the thermally conductive adhesive 25 to the mounting substrate 22. In addition, since the mounting substrate 22 is generally designed to mount a plurality electronic elements thereon and thus has a relatively large area and thus large thermal capacity as compared with the substrate 10 of the semiconductor device, a radiation effect is more improved than that of the semiconductor device known in the prior art as shown in FIG. 8.

When the semiconductor device shown in FIGS. 1 and 2 is to be mounted on the mounting substrate 22, the respective solder balls 18, 18, . . . of the semiconductor device are first placed on the predetermined connecting pads 26 provided on the circuit patterns (not shown) of the mounting substrate 22. Then, a reflow process is conducted to simultaneously connect the solder balls 18, 18, . . . to the connecting pads 26.

In such a reflow process, the semiconductor element 14 serves as a support member so that the degree of deformation of the respective solder balls 18 can be uniform. In this case, in order to prevent the solder bumps 16 on the other side of the semiconductor element 14 from being subjected to the reflow process, the melting point of the solder bumps 16 in the flip-chip process should be higher than that of the solder balls 18.

In place of using the solder bumps 16, it is also possible to make such bumps 16 from another metal, such as gold, and it is also possible to adjoin such gold bumps 16 to the respective ends of the conductive patterns by means of an electrically conductive adhesive.

In the semiconductor device shown in FIGS. 1 to 3, the substrate 10 is a ceramic substrate containing aluminum chloride. However, any other substrate having a good thermal conductivity can also be used as the substrate 10, such as an aluminum substrate, the surface of which is subjected to an alumilite process (anodic oxidation process) to form an insulation film and conductive patterns are formed thereon by sputtering or vaporing, or a so-called metal core substrate made of a copper plate, the surface of which is coated with a resin film and conductive patterns are formed thereon. In this case, a resin film having a copper foil on one of surfaces thereof is preferably used to form circuit patterns.

Since the substrate 10 is substantially rigid and therefore not to be deformed, the height of the solder balls 18, 18, . . . must be strictly controlled.

Figure 4:
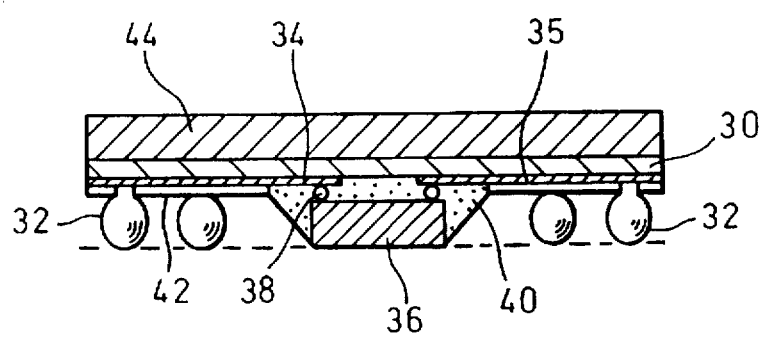
FIG. 4 is a cross-sectional view of another embodiment of a semiconductor device of this invention.

In the embodiment, shown in FIG. 4, a flexible circuit board 30 using a flexible film, such as a polyimide film, is used as a substrate.

In a semiconductor device shown in FIG. 4, inner ends of conductive patterns 34 formed on a surface of the flexible film 30 are connected to respective solder bumps 38 of a semiconductor element 36 by a flip-chip bonding process, and portions connected between the inner ends of conductive patterns 34 and the respective solder bumps 38 of a semiconductor element 36 are hermetically sealed with resin, i.e., underfilling material, so that the other side (lower side in FIG. 4) of the semiconductor element is exposed from the underfilling material 40.

In the semiconductor device of this embodiment, the exposed portions of the conductive patterns 34, except for the pads for external connecting terminals, are also coated with solder resist 42, so that the pads for external connecting terminals and the other surface of the semiconductor element 36 are to be exposed faces.

At the other ends of the conductive patterns 34 pads are arranged for external connecting terminals, to which solder balls 32, 32, . . . are attached.

A heat radiation frame 44 made of a rigid body, such as metal, ceramic or resin body, preferably a metal body, is attached to the other surface of the flexible circuit board 30.

In the embodiment shown in FIG. 4, since the heat radiation frame 44 is rigid and therefore not to be deformed, although the flexible circuit board 30 is used, the height of the solder balls 32, 32, . . . must strictly be controlled, in the same manner as the previous embodiment. In this case, however, it is preferable to use an elastic resin, such as silicone resin or epoxy resin including silicone, as the underfilling material 40 to ease the strict requirement for controlling the height of the solder balls 32, 32 . . . . In this case, due to the elasticity of the flexible film 30, the requirement of height control of the solder balls 32, 32 . . . can be eased.

Figure 5:
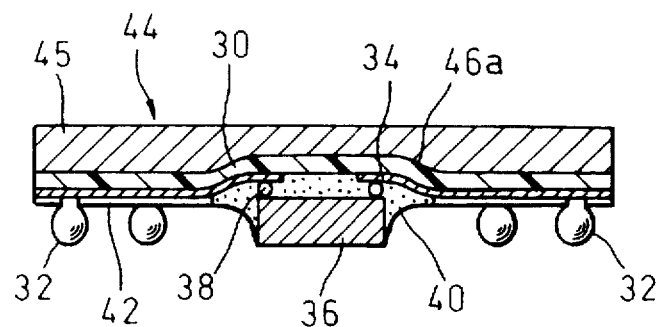
FIG. 5 is a cross-sectional view of still another embodiment of a semiconductor device of this invention.
Figure 6:
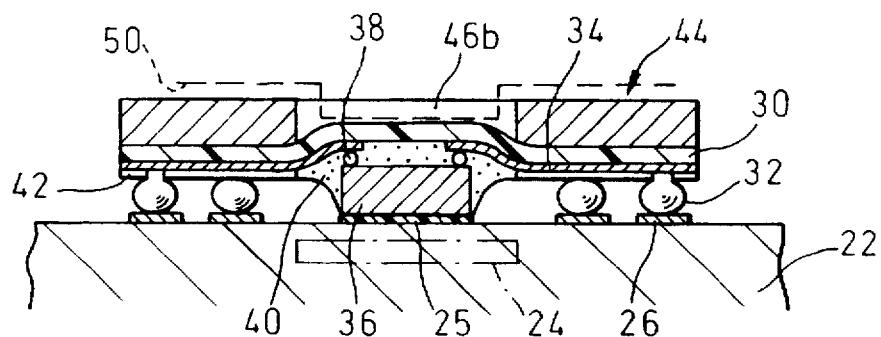
FIG. 6 is a cross-sectional view of a further embodiment of a semiconductor device mounted on a mounting substrate.

Contrary to the above embodiments, in the embodiments shown in FIGS. 5 and 6, it is possible to ease the strict requirement for controlling the height of the solder balls 32, 32, . . . as the external connecting terminals, since a heat radiation frame 44 attached to the other surface of the flexible circuit board 30 has a recess 46a (FIG. 5) or an opening 46b (FIG. 6) at a position corresponding to a chip mount area for mounting the semiconductor element 36. Thus, the solid frame portion of the heat radiation frame 44 is at a position to cover all of the external connecting terminals, i.e., the solder balls 32, 32, . . .

In the embodiment shown in FIGS. 5 and 6, the semiconductor device can be mounted on the mounting substrate 22 by pushing the frame 44 toward the latter. That is to say, the semiconductor device 36 is placed on a predetermined position of the mounting substrate 22 and pushed toward the latter so that the solder balls 32, 32, . . . can be abutted to the connecting pads 26 of the mounting substrate 22.

In this case, when the exposed surface of the semiconductor element 36 comes into contact with the mounting surface of the mounting substrate 22 and a force is exerted on the exposed surface of the semiconductor element 36 to deform the flexible circuit board 30 toward the other side of thereof (upward in FIGS. 5 and 6), the flexible circuit board 30 can be flexed with the semiconductor element 36 into the recess 46a (in FIG. 5) or opening 46b (in FIG. 6).

Therefore, even if the height of the solder balls 32, 32, . . . is smaller than that of the semiconductor element 36, the exposed surface of the semiconductor element 36 can be abutted appropriately to the mounting substrate 22.

That is to say, as shown in FIGS. 5 and 6, when the semiconductor device having such solder balls 32, 32, . . . the height of which is smaller than that of the semiconductor element 36, is mounted on the mounting substrate 22, the semiconductor element 36 is pushed toward (upward in FIGS. 5 and 6) the other side of the flexible circuit board 30. By this pushing force, a chip mount portion of the flexible circuit board 30 is bent and thus the flexible circuit board 30 can be flexed with the semiconductor element 36 into the recess 46a (in FIG. 5) or opening 46b (in FIG. 6). Such a recess 46a can also be formed by mechanically pressing the heat radiation frame 44.

Thus, as mentioned above, in the embodiments shown in FIGS. 5 and 6, it is possible to ease the strict requirement for controlling the height of the solder balls 32, 32, . . . as compared with the embodiments shown in FIGS. 1–3 and FIG. 4. In this embodiment, a rigid type resin can be used as the underfilling material 40. In addition, although a rigid material may be used as the sealing resin 17 in the embodiments shown in FIGS. 1–4, a silicone resin adaptable to the film material 30 may advantageously be used as the sealing resin 40 in the embodiments shown in FIGS. 5 and 6.

In the embodiment of FIG. 6, a stay 50 can be used to push the semiconductor device toward the mounting substrate 22, when the semiconductor device is mounted on the mounting substrate 22.

In the embodiments shown in FIGS. 4–6, the exposed surface of the semiconductor element 14 can be in contact with and firmly adhered to the surface of the mounting substrate 22 by means of a thermally conductive adhesive 25 containing metal particles, made of a material such as copper, in the same manner as the embodiment of FIGS. 1–3.

Figure 7:
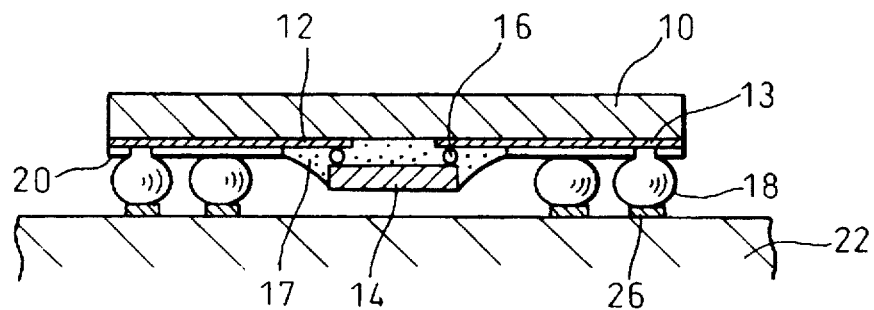
FIG. 7 is a cross-sectional view of a still further embodiment of a semiconductor device mounted on a mounting substrate.

In the previous embodiments, although the exposed surface of the semiconductor element 14 or 36 is in contact with the surface of the mounting substrate 22, when the semiconductor element 14 is mounted on the latter, in the embodiment shown in FIG. 7, the exposed surface of the semiconductor element 14 is not in contact with the surface of the mounting substrate 22.

The embodiment shown in FIG. 7 is similar to the embodiment shown in FIGS. 1–3, except that the semiconductor element 14 does not contact the mounting substrate 22. In the embodiment of FIG. 7, even though a gap remains between the semiconductor element 14 and the mounting substrate 22, a heat radiation efficiency is better than that of the prior art as shown in FIG. 8, since the other side of the semiconductor element 14 is exposed from the layer 17 of underfilling material.

Thus, the heat generated in the semiconductor element 14 is radiated from the other surface, i.e., the exposed surface (lower surface in FIG. 7), of the semiconductor element 14 and also radiated through the solder bumps 16 to the substrate 10.

It is preferable that a cooling air be applied toward the exposed surface of the semiconductor element 14 to promote the heat radiation therefrom.

In the embodiments shown in FIGS. 1–3, 4, 5, and 6, it is preferable that the mounting substrate 22 be provided with a metal layer 24 made of a copper foil or copper plate, having a good thermal conductivity, at an area where the other surface of the semiconductor element 14 or 36 comes into contact.

Also, in these embodiments, although the semiconductor element 14 is in contact with the mounting substrate 22 by means of the thermally conductive adhesive 25, it is also possible for the semiconductor element 14 to directly contact the mounting substrate 22 without any adhesive 25.

The solder balls 18 or 32 as the external connecting terminals may also be such that each ball comprises a central ball solid body, made of a material such as copper, and a low-melting point metal plated layer, such as a solder layer, coating the central ball. Otherwise, pins each having a controlled length (not shown) can also be employed in place of solder balls 18 or 32.

It should be understood by those skilled in the art that the foregoing description relates to only some preferred embodiments of the disclosed invention, and that various changes and modifications may be made to the invention without departing from the spirit and scope thereof.

We claim:

1. A semiconductor device comprising:

a semiconductor element having first and second surfaces, said semiconductor element having connecting terminals on said first surface;

a substrate having a surface from which external connecting terminals comprising solder balls extend, and on which conductive patterns are formed, so that said connecting terminals of the semiconductor element are electrically connected to said external connecting terminals by means of said conductive patterns;

said connecting terminals of the semiconductor element each being connected to one end of respective ones of said conductive patterns of the substrate by a flip-chip bonding; and a resin for hermetically sealing said connecting terminals of the semiconductor element, so that said second surface of the semiconductor element is exposed;

wherein the semiconductor element and the connecting terminals have a thickness which is substantially the same as the diameters of the solder balls.

2. A semiconductor device as set forth in claim 1, wherein said substrate is made of ceramic containing aluminum nitride.

3. A semiconductor device comprising:

a semiconductor element having first and second surfaces, said semiconductor element having connecting terminals on said first surface:

a flexible substrate made of a flexible film having a first surface, from which external connecting terminals comprising solder balls extend, and conductive patterns are formed, and a second surface, so that said connecting terminals of the semiconductor element are electrically connected to said external connecting terminals by means of said conductive patterns;

said connecting terminals of the semiconductor element each being connected to one end of respective ones of said conductive patterns of the substrate by a flip-chip bonding;

a resin for hermetically sealing said connecting terminals of the semiconductor element, so that said second surface of the semiconductor element is exposed; and a heat radiating frame attached to said second surface of the flexible substrate;

wherein the semiconductor element and the connecting terminals have a thickness which is substantially the same as the diameters of the solder balls.

4. A semiconductor device as set forth in claim 3, wherein said heat radiating frame is a heat radiating metal frame.

5. A mount structure for a semiconductor device, comprising:

a semiconductor device comprising:

a semiconductor element having first and second surfaces, said semiconductor element having connecting terminals on said first surface;

a substrate having a surface on which external connecting terminals and conductive patterns are formed, so that said connecting terminals of the semiconductor element are electrically connected to said external connecting terminals by means of said conductive patterns;

said connecting terminals of the semiconductor element being connected to one ends of said conductive patterns of the substrate by a flip-chip bonding; and resin for hermetically sealing said connecting terminals of the semiconductor element, so that said second surface of the semiconductor element is exposed;

a mounting substrate having a surface provided with circuit patterns; and said semiconductor device being mounted on said mounting substrate in such a manner that said external connecting terminals are electrically connected to said circuit patterns of the mounting substrate and said second surface of the semiconductor element comes into contact with said surface of the mounting substrate.

6. A mount structure as set forth in claim 5, wherein said external connecting terminals are solder balls and a temperature of said flip-chip bonding is higher than a melting point of said solder ball.

7. A mount structure as set forth in claim 5, wherein said substrate is made of ceramic containing aluminum nitride.

8. A mount structure as set forth in claim 5, wherein said second surface of the semiconductor element comes into contact with said surface of the mounting substrate by means of a thermally conductive adhesive layer.

9. A mount structure for a semiconductor device, comprising:

a semiconductor device comprising:

a semiconductor element having first and second surfaces, said semiconductor element having connecting terminals on said first surface;

a flexible substrate made of a flexible film having a first surface, on which external connecting terminals and conductive patterns are formed, and a second surface, so that said connecting terminals of the semiconductor element are electrically connected to said external connecting terminals by means of said conductive patterns;

said connecting terminals of the semiconductor element being connected to one ends of said conductive patterns of the substrate by a flip-chip bonding;

resin for hermetically sealing said connecting terminals of the semiconductor element, so that said second surface of the semiconductor element is exposed; and a heat radiating frame attached to said second surface of the flexible substrate; and a mounting substrate having a surface provided with circuit patterns; and said semiconductor device being mounted on said mounting substrate in such a manner that said external connecting terminals are electrically connected to said circuit patterns of the mounting substrate and said second surface of the semiconductor element comes into contact with said surface of the mounting substrate.

10. A mount structure as set forth in claim 9, wherein said external connecting terminals are solder balls and a temperature of said flip-chip bonding is higher than a melting point of said solder ball.

11. A mount structure as set forth in claim 9, wherein said heat radiating frame is a heat radiating metal frame.

12. A mount structure as set forth in claim 9, wherein said flexible substrate has an element mount area within which said semiconductor element is mounted by said flip-chip bonding, said heat radiating frame has a recess or opening at a position corresponding to said element mount area, and said flexible substrate is flexed into said recess or opening of said heat radiating frame.

13. A mount structure as set forth in claim 9, wherein said second surface of the semiconductor element comes into contact with said surface of the mounting substrate by means of a thermally conductive adhesive layer.

14. A semiconductor device comprising:

a semiconductor element having first and second surfaces, said semiconductor element having connecting terminals on said first surface;

a flexible substrate made of a flexible film having a first surface, on which external connecting terminals, conductive patterns and an element mounting area within which said semiconductor element is mounted are formed, and a second surface, so that said connecting terminals of the semiconductor element are electrically connected to said external connecting terminals by means of said conductive patterns;

each of said connecting terminals being connected to one end of respective ones of said conductive patterns of the substrate by a flip-chip bonding;

a resin for hermetically sealing said connecting terminals of the semiconductor element, so that said second surface of the semiconductor element is exposed; and a heat radiating frame attached to said second surface of the flexible substrate, which has a recess or opening at a position corresponding to said element mounting area of said flexible substrate.

15. A semiconductor device as set forth claim 14, wherein said second surface of the semiconductor element is at the same level as tops of external connector terminals comprising solder balls, when said semiconductor device is mounted on a mounting substrate.

* * * * *